(12) United States Patent
Chan et al.

(10) Patent No.: US 6,440,875 B1
(45) Date of Patent: Aug. 27, 2002

(54) MASKING LAYER METHOD FOR FORMING A SPACER LAYER WITH ENHANCED LINEWIDTH CONTROL

(75) Inventors: Bor-Wen Chan, Hsin-Chu; Mei-Ru Kuo, Win-Lin, both of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/848,248

(22) Filed: May 2, 2001

(51) Int. Cl.$^7$ .................. H01L 21/31; H01L 21/336; H01L 21/3205; H01L 21/44; H01L 21/8238

(52) U.S. Cl. .............. 438/778; 438/303; 438/595; 438/597; 438/778; 438/231

(58) Field of Search ................ 438/231, 778, 438/303, 597, 595, 266

(56) References Cited

U.S. PATENT DOCUMENTS 5,573,965 A 11/1996 Chen et al.
5,783,475 A 7/1998 Ramaswami
6,069,042 A 5/2000 Chien et al.

OTHER PUBLICATIONS

IBM Technical Disclosure Bulletin, Oct. 1, 1989, vol. No. 32, Issue No. 5A, pp. 110–111.*

* cited by examiner

*Primary Examiner*—Richard Elms
*Assistant Examiner*—Michael K. Luhrs
(74) *Attorney, Agent, or Firm*—Tung & Associates

(57) ABSTRACT

Within a method for forming a spacer layer, there is first provided a substrate having formed thereover a topographic feature in turn having formed thereover a second microelectronic layer formed of a second material having a second thickness in turn having formed thereover a first microelectronic layer formed of a first material having a first thickness. Within the method, the first material serves as an etch stop for second material and the first thickness is less than the second thickness. The first microelectronic layer and the second microelectronic layer are then successively etched to ultimately form a spacer layer with enhanced dimensional control.

14 Claims, 2 Drawing Sheets

MASKING LAYER METHOD FOR FORMING A SPACER LAYER WITH ENHANCED LINEWIDTH CONTROL

BACKGROUND OF THE INVENTION

1. Field of the Invention

The present invention relates generally to methods for forming spacer layers within microelectronic fabrications. More particularly, the present invention relates to method for forming, with enhanced linewidth control, spacer layers within microelectronic fabrications.

2. Description of the Related Art

Microelectronic fabrications are formed from microelectronic substrates over which are formed patterned microelectronic conductor layers which are separated by microelectronic dielectric layers.

Common in the art of microelectronic fabrication for use when fabricating microelectronic fabrication structures when fabricating microelectronic fabrications, and in particular for use when fabricating field effect transistor (FET) device structures when fabricating semiconductor integrated circuit microelectronic fabrications, is the use of spacer layers. Spacer layers are desirable in the art of microelectronic fabrication for use when fabricating microelectronic fabrication structures when fabricating microelectronic fabrications insofar as spacer layers, and in particular as employed adjacent gate electrodes within field effect transistor (FET) device structures within semiconductor integrated circuit microelectronic fabrications, allow for proper placement of additional microelectronic structures which are employed when fabricating microelectronic fabrications.

While spacer layers are thus desirable in the art of microelectronic fabrication and clearly often essential in the art of microelectronic fabrication, spacer layers are nonetheless not entirely without problems in the art of microelectronic fabrication.

In that regard, it is often difficult within the art of microelectronic fabrication to form within microelectronic fabrications spacer layers with optimal dimensional control, insofar as spacer layers are generally formed within microelectronic fabrications while employing etching methods which in turn provide spacer layers with substantial dimensional dependence upon etch parameters.

It is thus desirable in the art of microelectronic fabrication to provide methods and materials through which there may be formed within microelectronic fabrications spacer layers with enhanced dimensional control.

It is towards the foregoing object that the present invention is directed.

Various methods have been disclosed in the art of microelectronic fabrication, and in particular in the art of semiconductor integrated circuit microelectronic fabrication, for forming spacer layers with desirable properties in the art of microelectronic fabrication.

Included among the methods, but not limited among the methods, are methods disclosed within: (1) Chen et al., in U.S. Pat. No. 5,573,965 (a method for forming, with attenuated etching degradation, a silicon oxide spacer layer adjoining a gate electrode within a field effect transistor (FET) within a semiconductor integrated circuit microelectronic fabrication, by employing when forming a conformal silicon oxide layer from which is formed the silicon oxide spacer layer a thermal growth method followed by a deposition method in turn followed by an additional thermal growth method); (2) Ramaswami, in U.S. Pat. No. 5,783,475 (a method for forming, with attenuated silicon semiconductor substrate etching, a spacer layer adjacent a gate electrode within a field effect transistor (FET) within a semiconductor integrated circuit microelectronic fabrication, by employing a series of three conformal dielectric layers formed successively upon the gate electrode and successively anisotropically and isotropically removing portions therefrom); and (3) Chien et al., in U.S. Pat. No. 6,069,042 (a method for forming, with enhanced dimensional control, a spacer layer adjacent a floating gate within a split gate field effect transistor (FET) device within a semiconductor integrated circuit microelectronic fabrication, by employing, in part, a bi-layer dielectric layer which is anisotropically etched to form the spacer layer).

Desirable in the art of microelectronic fabrication, and in particular in the art of semiconductor integrated circuit microelectronic fabrication, are additional methods and materials which may be employed for forming within microelectronic fabrications spacer layers with enhanced dimensional control.

It is towards the foregoing object that the present invention is directed.

SUMMARY OF THE INVENTION

A first object of the present invention is to provide a method for forming within a microelectronic fabrication a spacer layer.

A second object of the present invention is to provide a method in accord with the first object of the present invention, wherein the spacer layer is formed with enhanced dimensional control.

A third object of the present invention is to provide a method in accord with the first object of the present invention and the second object of the present invention, wherein the method is readily commercially implemented.

In accord with the objects of the present invention there is provided by the present invention a method for forming within a microelectronic fabrication a spacer layer.

To practice the method of the present invention, there is first provided a substrate. There is then formed over the substrate a topographic feature. There is then formed conformally over the topographic feature a second microelectronic layer formed of a second material and having a second thickness. There is then formed conformally upon the second microelectronic layer a first microelectronic layer formed of a first material and having a first thickness. Within the present invention, the first mater al serves as an etch stop with respect to the second material and the first thickness is less than the second thickness. There is then etched, while employing a first anisotropic etch method, the first microelectronic layer to form a spacer mask layer upon the second microelectronic layer. Finally, there is then etched, while employing a second anisotropic etch method selective to the second material, the second microelectronic layer to form a spacer layer while employing the spacer mask layer as an etch mask layer.

There is provided by the present invention a method for forming within a microelectronic fabrication a spacer layer, wherein the spacer layer is formed with enhanced dimensional control.

The present invention realizes the foregoing object by employing when forming a spacer layer from a blanket second microelectronic layer formed of a second material and having a second thickness formed conformally over a topographic feature formed over a substrate employed within a microelectronic fabrication a first microelectronic layer formed of a first material and having a first thickness formed conformally upon the second microelectronic layer. Within the present invention, the first material serves as an etch stop with respect to the second material and the first thickness is less than the second thickness. Since the first thickness is less than the second thickness, a spacer mask layer formed incident to anisotropic etching of the first microelectronic layer is formed with enhanced dimensional control, and since the spacer mask layer is employed in a self aligned fashion when forming a spacer layer from the second microelectronic layer, the spacer layer is thus also formed with enhanced dimensional control.

The method of the present invention is readily commercially implemented. The present invention employs methods and materials as are generally known in the art of microelectronic fabrication, but employed within the context of specific process limitations to provide a method for forming a spacer layer in accord with the present invention. Since it is thus at least in part a series of process limitations which provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
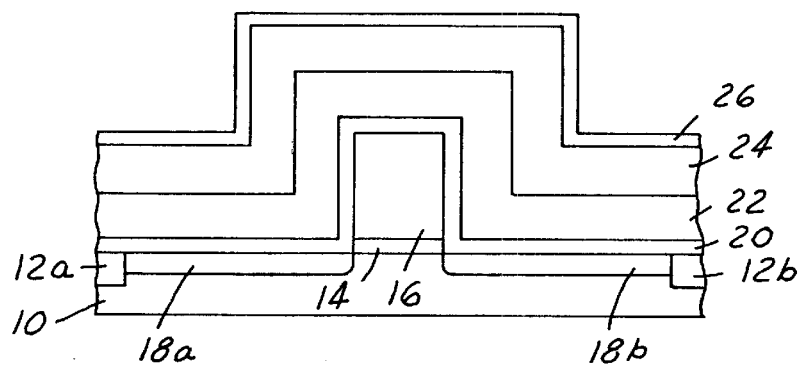
FIG. 1, FIG. 2, FIG. 3, FIG. 4, FIG. 5 and FIG. 6 show a series of schematic cross-sectional diagrams illustrating the results of progressive stages of forming within a microelectronic fabrication, and in accord with a preferred embodiment of the present invention, a field effect transistor (FET) device having formed adjacent its gate electrode a spacer layer.

There is provided by the present invention a method for forming within a microelectronic fabrication a spacer layer, wherein the spacer layer is formed with enhanced dimensional control.

The present invention realizes the foregoing object by employing when forming a spacer layer from a blanket second microelectronic layer formed of a second material and having a second thickness formed conformally over a topographic feature formed over a substrate employed within a microelectronic fabrication a first microelectronic layer formed of a first material and having a first thickness formed conformally upon the second microelectronic layer. Within the present invention, the first material serves as an etch stop with respect to the second material and the first thickness is less than the second thickness. Since the first thickness is less than the second thickness, a spacer mask layer formed incident to anisotropic etching of the first microelectronic layer is formed with enhanced dimensional control, and since the spacer mask layer is employed in a self aligned fashion when forming a spacer layer from the second microelectronic layer, the spacer layer is thus also formed with enhanced dimensional control.

Although the preferred embodiment of the present invention illustrates the present invention most particularly within the context of forming a dielectric spacer layer adjacent a sidewall of a gate electrode employed within a field effect transistor (FET) device employed within a semiconductor integrated circuit microelectronic fabrication, a spacer layer formed in accord with the present invention may be formed of microelectronic materials including but not limited to microelectronic conductor materials, microelectronic semiconductor materials and microelectronic dielectric materials, and formed adjacent a sidewall of any of several types of topographic features employed within any of several types of microelectronic fabrications. In that regard, a topographic feature adjacent which may be formed a spacer layer in accord with the present invention may be selected from the group including but not limited to topographic conductor features, topographic semiconductor features and topographic dielectric features. Similarly in that regard, a topographic feature adjacent which may be formed a spacer layer in accord with the present invention may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 6, there is shown a series of schematic cross-sectional diagrams illustrating the results of progressive stages of forming within a semiconductor integrated circuit microelectronic fabrication, and in accord with a preferred embodiment of the present invention, a field effect transistor (FET) device having formed adjacent its gate electrode a spacer layer fabricated in accord with the present invention.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10, having formed therein a pair of isolation regions 12a and 12b which define an active region of the semiconductor substrate 10.

Within the preferred embodiment of the present invention with respect to the semiconductor substrate 10, and although it is known in the art of semiconductor integrated circuit microelectronic fabrication that semiconductor substrates are available with either dopant polarity, several dopant concentrations and various crystallographic orientations, for the preferred embodiment of the present invention, the semiconductor substrate 10 is typically and preferably a (100) silicon semiconductor substrate having an N- or P-doping.

Similarly, within the preferred embodiment of the present invention with respect to the pair of isolation regions 12a and 12b which define the active region of the semiconductor substrate 10, and although it is also known in the art of semiconductor integrated circuit microelectronic fabrication that isolation regions may be formed within semiconductor substrates to define active regions of semiconductor substrates while employing methods including but not limited to isolation region thermal growth methods and isolation region deposition/patterning methods, for the preferred embodiment of the present invention, the pair of isolation regions 12a and 12b is, as is illustrated within the schematic cross-sectional diagram of FIG. 1, formed as a pair of shallow trench isolation (STI) regions formed employing at least in part an isolation region deposition/patterning method.

Shown also within the schematic cross-sectional diagram of FIG. 1, and formed upon the active region of the semiconductor substrate 10 is a gate dielectric layer 14 having formed aligned thereupon a gate electrode 16. Similarly, there is also shown within the schematic cross-sectional diagram of FIG. 1 formed into the active region of the semiconductor substrate 10 at areas not covered by the gate dielectric layer 14 and the gate electrode 16 a pair of lightly doped drain (LDD) extension regions 18a and 18b. As is understood by a person skilled in the art, the gate dielectric layer 14, the gate electrode 16 and the pair of lightly doped drain (LDD) extension regions 18a and 18b are structures which comprise, in-part, a field effect transistor (FET) device which is formed incident to further processing of the semiconductor integrated circuit microelectronic fabrication whose schematic cross-sectional diagram is illustrated in FIG. 1. Similarly, each of the foregoing structures of the field effect transistor (FET) device may be formed employing methods and materials as are generally conventional in the art of semiconductor integrated circuit microelectronic fabrication.

For example and without limitation, and although it is known in the art of semiconductor integrated circuit microelectronic fabrication that gate dielectric layers may be formed of dielectric materials including but not limited to silicon oxide dielectric materials, silicon nitride dielectric materials and silicon oxynitride dielectric materials, for the preferred embodiment of the present invention the gate dielectric layer 14 is typically and preferably formed of a silicon oxide dielectric material, formed to a thickness of from about 10 to about 30 angstroms upon the active region of the semiconductor substrate 10. In addition, and also for example and without limitation, and although it is also known in the art of semiconductor integrated circuit microelectronic fabrication that gate electrodes may be formed of materials including but not limited to metal, metal alloy, doped polysilicon and polycide (doped polysilicon/metal silicide stack) gate electrode materials, for the preferred embodiment of the present invention, the gate electrode 16 is typically and preferably formed of a doped polysilicon gate electrode material formed to a thickness of from about 1000 to about 2500 angstroms upon the gate dielectric layer 14. Finally, and also for example and without limitation, the pair of lightly doped drain (LDD) extension regions 18a and 18b is typically and preferably formed into the active region of the semiconductor substrate 10 at areas not covered by the gate dielectric layer 14 and the gate electrode 16 while employing an appropriate dopant ion at an ion implantation dose of from about 5E5 to about 20E6 dopant ions per square centimeter and an ion implantation energy of from about 100 to about 500 Kev.

Finally, there is also shown within the schematic cross-sectional diagram of FIG. 1, and formed successively conformally upon the isolation regions 12a and 12b, the active region of the semiconductor substrate 10, the gate dielectric layer 14 and the gate electrode 16, a series of four blanket conformal layers. The series of four blanket conformal layers comprises: (1) a blanket conformal liner layer 20 formed upon the pair of isolation regions 12a and 12b, the active region of the semiconductor substrate 10, the gate dielectric layer 14 and the gate electrode 16; (2) a blanket conformal second spacer material layer 22 formed upon the blanket conformal liner layer 20; (3) a blanket conformal first spacer material layer 24 formed upon the blanket conformal second spacer material layer 22; and (4) a blanket conformal spacer mask layer 26 formed upon the blanket conformal first spacer material layer 24.

Within the preferred embodiment of the present invention with respect to each of the foregoing blanket conformal layers, each of the foregoing blanket layers is formed of a material which serves as an etch mask material for an immediately underlying blanket conformal layer upon which it is formed. Thus, it is recognized in accord with a most general embodiment of the present invention that any of the foregoing blanket conformal layers may independently be formed of microelectronic materials selected from the group consisting of microelectronic conductor materials, microelectronic semiconductor materials and microelectronic dielectric materials, provided that the foregoing etch mask material restrictions are realized within the context of specific materials combinations and specific etchant combinations with respect to forming and etching each of the four foregoing blanket conformal layers.

However, in order to provide a clear example of the present invention, which is by no means limiting of the present invention, the blanket conformal liner layer 20 is typically and preferably formed of a silicon oxide dielectric material such as to isolate the gate electrode 16, the blanket conformal second spacer material layer 22 is typically and preferably formed of a silicon nitride dielectric material, the blanket conformal first spacer material layer 24 is typically and preferably formed of a silicon oxide dielectric material and the blanket conformal spacer mask layer 26 is typically and preferably formed of a silicon nitride dielectric material.

Within the present invention and the preferred embodiment of the present invention, the blanket conformal liner layer 20 is typically and preferably formed to a thickness of from about 50 to about 300 angstroms; (2) the blanket conformal second spacer material layer 22 is typically and preferably formed to a thickness of from about 200 to about 700 angstroms; (3) the blanket conformal first spacer material layer 24 is typically and preferably formed to a thickness of from about 500 to about 3000 angstroms; and (4) the blanket conformal spacer mask layer 26 is typically and preferably formed to a thickness of from about 50 to about 300 angstroms.

Significant to the present invention is that the blanket conformal spacer mask layer 26 is formed to a thickness less than the thickness of at least the aggregate of the blanket conformal liner layer 20, the blanket conformal second spacer material layer 22 and the blanket conformal first spacer material layer 24, and more particularly less than the thickness of the blanket conformal first spacer material layer 24 alone.

Figure 2:
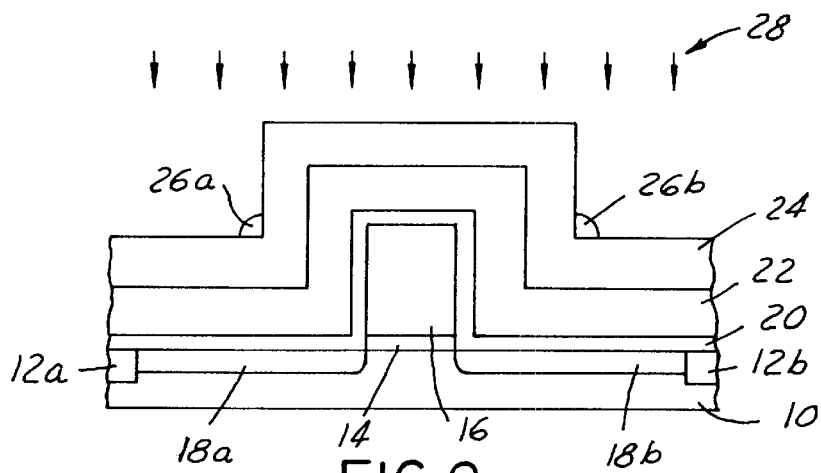

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket conformal spacer mask layer 26 has been anisotropically etched within a first anisotropic etching plasma 28 to form therefrom a pair of patterned spacer mask layers 26a and 26b formed upon the blanket conformal first spacer material layer 24.

Within the preferred embodiment of the present invention, and with respect to the first anisotropic etching plasma 28, and further under circumstances where the blanket conformal spacer mask layer 26 is formed of a silicon nitride material and the blanket conformal first spacer material layer 24 is formed of a silicon oxide material, the first anisotropic etching plasma 28 typically and preferably employs an etchant gas composition comprising sulfur hexafluoride and oxygen. Typically and preferably, when anisotropically etching the blanket conformal spacer mask layer 26 to form the pair of patterned spacer mask layers 26a and 26b formed upon an eight inch diameter semiconductor substrate 10, the first anisotropic etching plasma 28 also employs: (1) a reactor chamber pressure of from about 50 to about 300 torr; (2) a bias radio frequency power of from about 200 to about 700 watts; (3) a semiconductor substrate 10 temperature of from about 10 to about 40 degrees centigrade; (4) a sulfur hexafluoride flow rate of from about 10 to about 50 standard cubic centimeters per minute (sccm) (5) an oxygen flow rate of from about 10 to about 100 standard cubic centimeters per minute (sccm).

As is understood by a person skilled in the art, when anisotropically etching the blanket conformal spacer mask layer 26 to form the pair of patterned spacer mask layers 26a and 26b, it is not entirely required that the blanket conformal first spacer material layer 24 act as an etch stop layer, particularly under circumstances where dimensional control when forming the pair of patterned spacer mask layers 26a and 26b might not otherwise be optimal. Thus, it is also feasible to employ a sputter etchant within the first anisotropic etching plasma 28 such as to optimize dimensional control when forming the pair of patterned spacer mask layers 26a and 26b from the blanket conformal spacer mask layer 26.

Similarly, as is also understood by a person skilled in the art, insofar as the blanket conformal spacer mask layer 26 is formed as a generally thin layer, incident to forming the pair of patterned spacer mask layers 26a and 26b therefrom, the pair of patterned spacer mask layers 26a and 26b is formed with enhanced linewidth control insofar as variations in etch time or etch conditions employed when forming from the blanket conformal spacer mask layer 26 the pair of patterned spacer mask layers 26a and 26b have a generally lessened effect upon linewidth dimensions of the pair of patterned spacer mask layers 26a and 26b since the pair of patterned spacer mask layers 26a and 26b is formed from the comparatively generally thin layer.

Figure 3:
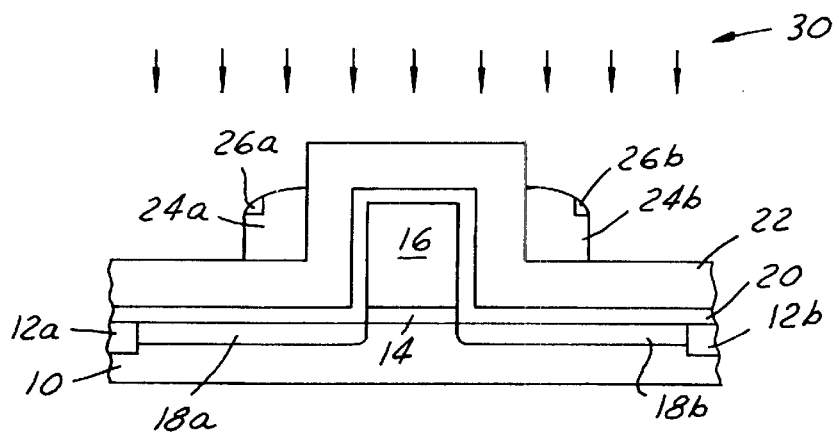

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the blanket conformal first spacer material layer 24 has been anisotropically etched to form a pair of first spacer layers 24a and 24b while employing the pair of patterned spacer mask layers 26a and 26b as a pair of etch mask layers, while employing a second anisotropic etching plasma 30.

Within the present invention and the preferred embodiment of the present invention under circumstances where the pair of patterned spacer mask layers 26a and 26b is formed of a silicon nitride material, the blanket conformal first spacer material layer 24 is formed of a silicon oxide material and the blanket conformal second spacer material layer 22 is formed of a silicon nitride material, the second anisotropic etching plasma 30 typically and preferably employs an etchant gas composition comprising octafluorocyclobutane and helium. Typically and preferably, when etching the blanket conformal first spacer material layer 24 to form the pair of patterned first spacer layers 24a and 24b formed upon an eight inch diameter semiconductor substrate 10, the second anisotropic etching plasma 30 also employs: (1) a reactor chamber pressure of from about 50 about 300 torr; (2) a bias radio frequency power of from about 700 to about 1300 watts; (3) a semiconductor substrate 10 temperature of from about 10 to about 40 degrees centigrade; (4) an octafluorocyclobutane flow rate of from about 0 to about 100 standard cubic centimeters per minute (sccm); and (5) a argon flow rate of from about 100 to about 300 standard cubic centimeters per minute (sccm).

As is further understood by a person skilled in the art, and in accord with the above, by employing when forming within the semiconductor integrated circuit microelectronic fabrication whose schematic cross-sectional diagram is illustrated in FIG. 3 the pair of patterned spacer mask layers 26a and 26b for forming the pair of first spacer layers 24a and 24b, the pair of first spacer layers 24a and 24b is formed with enhanced linewidth control. As is yet further understood by a person skilled in the art, and as will be further illustrated below, the enhanced linewidth control of the pair of patterned first spacer layers 24a and 24b is employed for forming with correlating enhanced linewidth control a pair of second spacer layers through further processing of the semiconductor integrated circuit microelectronic fabrication whose schematic cross-sectional diagram is illustrated in FIG. 3.

Figure 4:
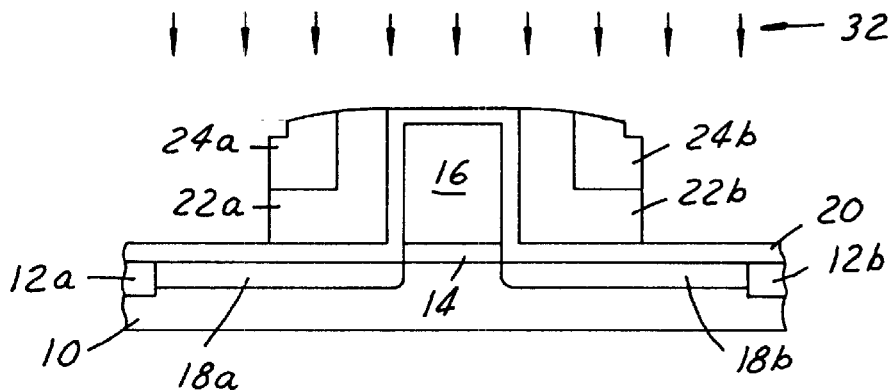

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein: (1) the pair of patterned spacer mask layers 26a and 26b has been stripped from the semiconductor integrated circuit microelectronic fabrication; and (2) the blanket conformal second spacer material layer 22 has been patterned to form a pair of second spacer layers 22a and 22b, while employing a third anisotropic etching plasma 32.

Within the present invention and the preferred embodiment of the present invention, the third anisotropic etching plasma 32 typically and preferably employs materials and process conditions analogous or equivalent to the materials and process conditions employed with respect to the first anisotropic etching plasma 28 as illustrated within the schematic cross-sectional diagram of FIG. 2.

Figure 5:
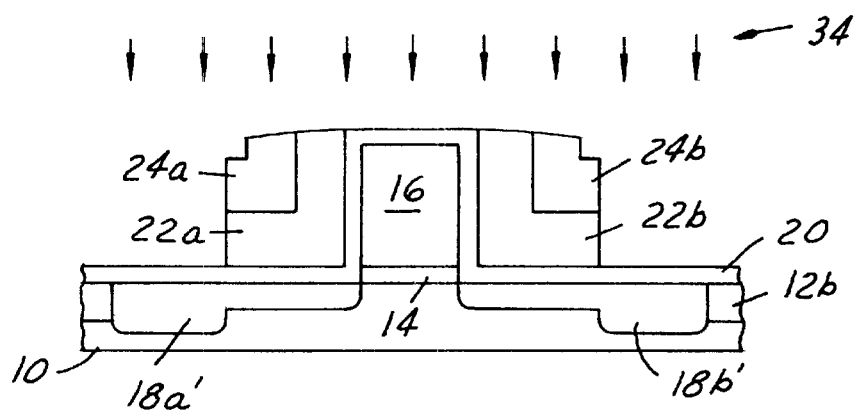

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there has been implanted into the active region of the semiconductor substrate while employing as a mask the pair of first spacer layers 24a and 24b, the pair of second spacer layers 22a and 22b, the blanket conformal liner layer 20, the gate electrode 16 and the gate dielectric layer 14, a dose of implanting dopant ions 34, to form from the pair of lightly doped drain (LDD) extension regions 18a and 18b as illustrated within the schematic cross-sectional diagram of FIG. 4 a pair of source drain regions 18a' and 18b' having incorporated therein the pair of lightly doped drain extension regions 18a and 18b as illustrated within the schematic cross-sectional diagram of FIG. 5

Within the present invention and the preferred embodiment of the present invention, the dose of implanting dopant ions 34 is typically and preferably provided employing a dopant ion concentration of from about 5E5 to about 20E6 dopant ions per square centimeter and an ion implantation energy of from about 100 to about 500 kev.

Figure 6:
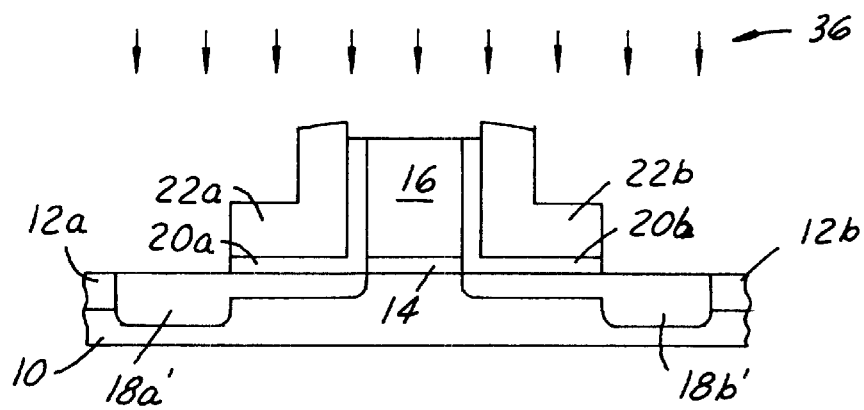

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein: (1) the pair of first spacer layers 24a and 24b has been stripped from the pair of second spacer layers 22a and 22b; and (2) the blanket conformal liner layer 22 has been patterned to form a pair of patterned conformal liner layers 22a and 22b while employing the pair of second spacer layers 24a and 24b as an etch mask layer, while employing a fourth anisotropic etching plasma 36.

Within the present invention and the preferred embodiment of the present invention, the fourth anisotropic etching plasma 36 typically and preferably employs materials and process conditions analogous or equivalent to the materials and process conditions employed within the second anisotropic etching plasma 30 as illustrated within the schematic cross-sectional diagram of FIG. 3.

Upon forming the microelectronic fabrication whose schematic cross-sectional diagram is illustrated in FIG. 6, there is formed a semiconductor integrated circuit microelectronic fabrication in accord with the preferred embodiment of the present invention. The semiconductor integrated circuit microelectronic fabrication has formed therein a pair of spacer layers formed adjacent a gate electrode within a field effect transistor (FET) within the semiconductor integrated circuit microelectronic fabrication, with enhanced dimensional control.

The present invention realizes the foregoing object by employing when forming a spacer layer from a blanket conformal spacer material layer formed of a second material and having a second thickness formed conformally over the gate electrode within the field effect transistor (FET) device within the semiconductor integrated circuit microelectronic fabrication a blanket conformal spacer mask layer formed of a first material and having a first thickness formed conformally upon the blanket conformal spacer material layer. Within the present invention, the first material serves as an etch stop with respect to the second material and the first thickness is less than the second thickness. Since the first thickness is less than the second thickness, a spacer mask layer formed incident to anisotropic etching of the blanket conformal spacer mask layer is formed with enhanced dimensional control, and since the spacer mask layer is employed in a self aligned fashion when forming a spacer layer from the blanket conformal spacer material layer, the spacer layer is thus also formed with enhanced dimensional control.

As is understood by a person skilled in the art, the present invention provides for enhanced linewidth control when ultimately forming a desirable "L" shaped spacer, or a pair of nested "L" shaped spacers, by employing at minimum a single additional blanket conformal layer formed over a topographic feature, in comparison with related methods as disclosed within the Description of the Related Art, the teaching from all of which related art are incorporated herein fully by reference. Thus, within its preferred embodiment, the present invention employs a minimum of four successively layered and separately etchable blanket conformal layers, rather than a minimum of three separately etchable blanket conformal layers.

As is further understood by a person skilled in the art, the preferred embodiment of the present invention is illustrative of the present invention rather than limiting of the present invention. Revisions and modifications may be made to methods, materials, structures and dimensions through which is provided a semiconductor integrated circuit microelectronic fabrication in accord with the preferred embodiment of the present invention, while still providing a method for forming a spacer layer in accord with the present invention, further in accord with the accompanying claims.

What is claimed is:

1. A method for forming a spacer layer comprising:
   providing a substrate;
   forming over the substrate a topographic feature;
   forming conformally over the topographic feature a second microelectronic layer formed of a second material having a second thickness;
   forming conformally upon the second microelectronic layer a first microelectronic layer formed of a first material having a first thickness, where the first material serves as an etch stop for the second material and the first thickness is less than the second thickness;
   etching, while employing a first anisotropic etch method, the first microelectronic layer to form a spacer mask layer upon the second microelectronic layer; and
   etching, while employing a second anisotropic etch method selective to the second material, the second microelectronic layer to form a spacer layer while employing the spacer mask layer as an etch mask layer.

2. The method of claim 1 wherein by providing the first thickness less than the second thickness, the spacer layer is formed with enhanced dimensional control.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the topographic feature has a sidewall surface.

5. The method of claim 1 wherein the topographic feature is formed from a microelectronic material selected from the group consisting of microelectronic conductor materials, microelectronic semiconductor materials and microelectronic dielectric materials.

6. The method of claim 1 wherein each of the first microelectronic layer and the second microelectronic layer is formed from a microelectronic material selected from the group consisting of microelectronic conductor materials, microelectronic semiconductor materials and microelectronic dielectric materials.

7. The method of claim 1 wherein:
the first microelectronic layer is formed to a thickness of from about 50 to about 300 angstroms; and
the second microelectronic layer is formed to a thickness of from about 500 to about 3000 angstroms.

8. The method of claim 1 further comprising at least two additional blanket conformal layers formed interposed between the second microelectronic layer and the topographic feature, wherein at least one of the additional blanket conformal layers is patterned while employing the spacer layer as a mask.

9. A method for forming a spacer layer comprising:
providing a semiconductor substrate;
forming over the semiconductor substrate a gate electrode;
forming conformally over the gate electrode a second microelectronic layer formed of a second material having a second thickness;
forming conformally upon the second microelectronic layer a first microelectronic layer formed of a first material having a first thickness, where the first material serves as an etch stop for the second material and the first thickness is less than the second thickness;
etching, while employing a first anisotropic etch method, the first microelectronic layer to form a spacer mask layer upon the second microelectronic layer; and
etching, while employing a second anisotropic etch method selective to the second material, the second microelectronic layer to form a spacer layer while employing the spacer mask layer as an etch mask layer.

10. The method of claim 9 wherein by providing the first thickness less than the second thickness, the spacer layer is formed with enhanced dimensional control.

11. The method of claim 9 wherein the gate electrode has a sidewall surface.

12. The method of claim 9 wherein each of the first microelectronic layer and the second microelectronic layer is formed from a microelectronic material selected from the group consisting of microelectronic conductor materials, microelectronic semiconductor materials and microelectronic dielectric materials.

13. The method of claim 9 wherein:
the first microelectronic layer is formed to a thickness of from about 50 to about 300 angstroms; and
the second microelectronic layer is formed to a thickness of from about 500 to about 3000 angstroms.

14. The method of claim 9 further comprising at least two additional blanket conformal layers formed interposed between the second microelectronic layer and the gate electrode, wherein at least one of the additional blanket conformal layers is patterned while employing the spacer layer as a mask.

\* \* \* \* \*